US 008278970B2

(12) United States Patent
Presti et al.

(10) Patent No.: US 8,278,970 B2
(45) Date of Patent: Oct. 2, 2012

(54) DEVICE FOR DETECTING THE PEAK VALUE OF A SIGNAL

(75) Inventors: Calogero Davide Presti, Caltanissetta (IT); Francesco Carrara, Acireale (IT); Antonino Scuderi, Misterbianco (IT); Giuseppe Palmisano, San Giovanni la Punta (IT)

(73) Assignee: ST-Ericsson SA, Geneva (CH)

( * ) Notice: Subject to any disclaimer, the term of this patent is extended or adjusted under 35 U.S.C. 154(b) by 79 days.

(21) Appl. No.: 13/013,492

(22) Filed: Jan. 25, 2011

(65) Prior Publication Data

US 2011/0115525 A1 May 19, 2011

Related U.S. Application Data

(63) Continuation of application No. 11/762,249, filed on Jun. 13, 2007, now Pat. No. 7,880,508.

(30) Foreign Application Priority Data

Jul. 14, 2006 (IT) .............................. TO2006A0515

(51) Int. Cl.
H03K 5/153 (2006.01)

(52) U.S. Cl. ............................... 327/58; 327/61; 327/62

(58) Field of Classification Search ............... 327/58–62
See application file for complete search history.

(56) References Cited

U.S. PATENT DOCUMENTS

| 4,027,152 A | 5/1977 | Brown et al. |
| 4,433,256 A | 2/1984 | Dolikian |
| 4,737,730 A | 4/1988 | Ishiwata et al. |
| 5,159,340 A | 10/1992 | Smith |
| 5,491,434 A | 2/1996 | Harnishfeger et al. |
| 5,589,778 A | 12/1996 | Ono et al. |
| 5,923,219 A * | 7/1999 | Ide et al. .................. 327/62 |
| 7,161,392 B2 | 1/2007 | Nakamura |
| 7,218,865 B2 | 5/2007 | Doh et al. |
| 7,355,456 B2 * | 4/2008 | Kurtzman et al. ............ 327/58 |
| 7,382,166 B1 | 6/2008 | Ide |
| 7,880,508 B2 * | 2/2011 | Presti et al. .................. 327/58 |
| 2008/0024175 A1 | 1/2008 | Carrara et al. |
| 2009/0015295 A1* | 1/2009 | Aoki et al. ..................... 327/58 |

OTHER PUBLICATIONS

Meyer "Low-Power Monolithic RF Peak Detector Analysis"; IEEE Journal of Solid-State Circuits; Jan. 1995; pp. 65-67; vol. 30, No. 1.
Millman, et al.; Microelettronica; 1994; pp. 56-57 and 765-766; McGraw Hill.

* cited by examiner

*Primary Examiner* — Long Nguyen
(74) *Attorney, Agent, or Firm* — William J. Kubida; Peter J. Meza; Hogan Lovells US LLP

(57) ABSTRACT

A device for detecting the peak value of a signal with crest factor not known a priori includes a pair of peak detectors, each of which includes a rectifier element and a discharge-current generator and generates a respective output signal that is a function of the ratio between a physical dimension of the rectifier element and the intensity of discharge current produced by the generator. The ratio is different for the two detectors, and a combination network combines the output signals of the two peak detectors with one another and produces a combined signal indicating the peak value sought with high accuracy.

4 Claims, 8 Drawing Sheets

DEVICE FOR DETECTING THE PEAK VALUE OF A SIGNAL

RELATED APPLICATION

The present application is a continuation of, U.S. patent application Ser. No. 11/762,249 filed on Jun. 13, 2007 claims priority of Italian Patent Application No. TO2006A000515 filed Jul. 14, 2006, and entitled Device for detecting THE PEAK VALUE OF A SIGNAL, which is incorporated herein in its entirety by this reference.

FIELD OF THE INVENTION

The present invention relates to peak-detector devices and regards in particular a device for detecting the peak value of a signal the crest factor of which is not known a priori. The invention has been developed with particular attention paid to its possible use in the field of telecommunications.

BACKGROUND OF THE INVENTION

The measurement of the peak value of a repetitive signal plays an important role in different applications, above all in the field of telecommunications. Said task is entrusted to circuits that assume the name of peak detectors. They are used, for example, in gain-control feedback systems in radio receivers and in optical-fibre connections, or else in power amplifiers with "envelope elimination and restoration".

Peak detectors can be effectively used also for protection of power transistors from the high overvoltages that arise in the case of high output mismatch. A circuit of this sort must be integrated together with the power transistor, since it has the task of monitoring the effective maximum voltage at the output terminal (drain/collector) of the transistor and producing a control signal for activating the protection circuitry readily and in a precise way.

However, traditional solutions suffer from various problems, such as the ones listed below:
the crest factor of the voltage at the output terminal (drain/collector) can vary considerably as a function of the phase of the load reflection coefficient; however, known circuit topologies are very sensitive to the effective waveform of the voltage to be detected, in effect producing an output that is all the more underestimated, the higher the crest factor of the voltage to be measured; and
the output signal is a non-linear function of the input peak value.

The above phenomena lead to the need for overprotection of the power transistor, causing a sensible drop in the nominal performance. In addition, the same phenomena are more accentuated in the case of MOSFET (Metal-Oxide Semiconductor Field-Effect Transistor) implementations having the topologies traditionally adopted. In addition to this, the design of said circuits is rendered particularly critical in the case of high-frequency signals and/or in the presence of constraints of power dissipation.

The solutions proposed in the literature for peak detection normally comprise an element for rectifying the input voltage and a capacitor for holding the peak value.

Described in J. Millman, et al., "Microelettronica", McGrawHill (1994), p. 60, is a first peak-detector circuit, reproduced in FIG. 1a. The rectifier element is in this case represented by a diode D1, the current $i_O$ of which depends upon the voltage applied according to the function indicated by $f_D$. The accumulation element is instead represented by a capacitance C. The generator $I_{DIS}$ has the purpose of discharging the capacitance C and determines how rapidly the circuit detects negative variations of the peak value of the signal. In said topology, the charge current $i_O$ of the capacitance C comes from the input signal, which can constitute a problem because it makes necessary oversizing of the upstream signal-conditioning stages.

In order to solve this problem, described in R. G. Meyer, "Low-Power Monolithic RF Peak Detector Analysis", IEEE J. Solid-State Circuits, vol. 30, pp. 65-67, (1995), is a second type of peak detector, reproduced in FIG. 1b, in which the diode D1 is replaced by a generic transistor T1. Operation is similar to that of the first circuit, but in this second case the charge current $i_O$ no longer comes from the input, thanks to the current gain of the transistor T1.

Both of the circuits are used with a weak discharge current; consequently, it is justifiable to neglect the residual ripple of the output voltage and to make $v_O(t)$ to coincide with its mean value $V_O$. On said hypothesis, it is possible to obtain an implicit and general relation between the input waveform and the output voltage. In fact, in periodic conditions, the temporal average of the charge current must coincide with the discharge current:

$$I_{DIS} = \frac{1}{2\pi} \int_{\alpha 1}^{\alpha 2} i_O(\omega t) d\omega t = \frac{1}{2\pi} \int_{\alpha 1}^{\alpha 2} f_{D,T}(v_I(\omega t) - V_O) d\omega t \quad (1)$$

Eq. (1) is an implicit relation that defines the mean value VO of the output voltage.

The effective input waveform markedly affects proper operation of the circuit, in so far as $v_I$ appears in the integrand and affects the value of $\alpha 1$ and $\alpha 2$, which are the initial conduction angle and final conduction angle, respectively. In other words, given the same peak value, the output $V_O$ is affected in an undesirable way by the effective waveform of $v_I$.

The dependence of $V_O$ upon the waveform applied at input is all the smaller, the closer the rectifying characteristic of the diode or of the transistor approaches the ideal situation. For this reason bipolar devices are better than FETs (Field-Effect Transistors), given their exponential transconductance.

As will be shown hereinafter, the error committed in the detection is greater if the input voltage has a higher crest factor.

In order to improve the accuracy of peak detection, described in J. Millman, A. Grabel, "Microelettronica", McGrawHill (1994), p. 834, is a detector belonging to the class of feedback detectors. The circuit of the feedback detector is shown in FIG. 2. A high-gain stage A is used for rendering the transconductance of the rectifier element closer to the ideal situation. In correct conditions of operation, the current $i_O$ is other than zero only for a few instants around the peak of $v_I$, compensating for the discharge current throughout the period. However, the solution is practicable only at relatively low frequencies, an additional propagation delay being present due to the gain stage.

It should be pointed out that in the circuits of FIGS. 1 and 2 the generator $I_{DIS}$ is sometimes replaced by a resistor, a fact that changes only to a minimal extent the equations obtained and in no way solves the problem in question.

SUMMARY OF THE PRESENT INVENTION

From the foregoing description of the current situation, it may be readily understood that there exists the need to define peak detectors with a reduced sensitivity to the crest factor of the input voltage.

The purpose of the present invention is to meet the aforesaid need.

In accordance with the present invention, the above purpose is achieved by means of a device having the characteristics recalled in the ensuing claims.

The claims form an integral part of the description of the invention provided herein.

In the currently preferred embodiment, the solution described herein regards a device for detecting the peak value of a signal with crest factor not known a priori. The device comprises a pair of peak detectors, each in turn comprising a rectifier element and a discharge element, in which the ratio between a physical dimension of the rectifier element and the intensity of discharge current produced by the discharge element is different for the two detectors of the pair. Each of the detectors generates a respective output signal that is a function of the aforesaid ratio between a physical dimension and the current intensity. The device further comprises a combination network for combining with one another the respective output signals and producing a combined signal indicating the peak value.

BRIEF DESCRIPTION OF THE DRAWINGS

The invention will now be described, purely by way of non-limiting example, with reference to the annexed plate of drawings, in which.

DETAILED DESCRIPTION OF EXEMPLARY EMBODIMENTS

Figure 1B:
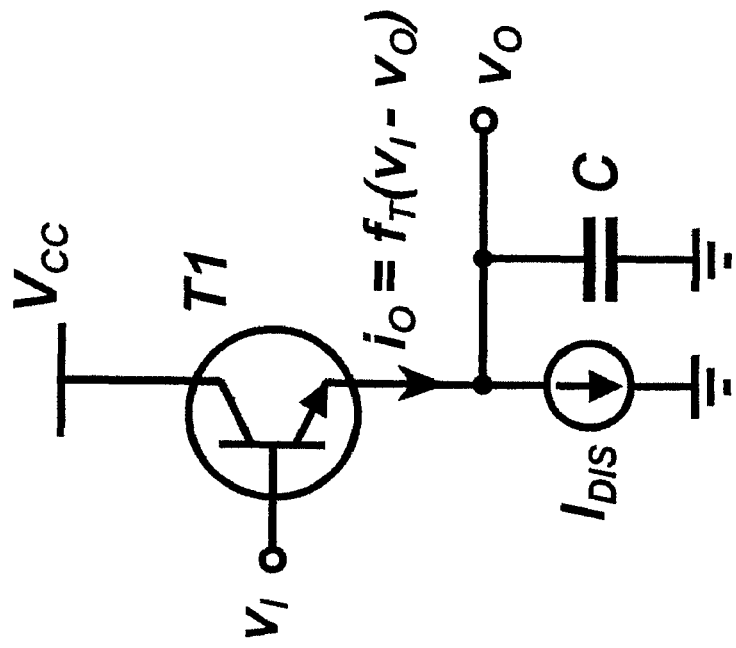
FIGS. 1a and 1b illustrate two peak-detector circuits according to the known art, with FIG. 1a illustrating a diode peak detector and FIG. 1b illustrating a transistor peak detector.
Figure 1A:
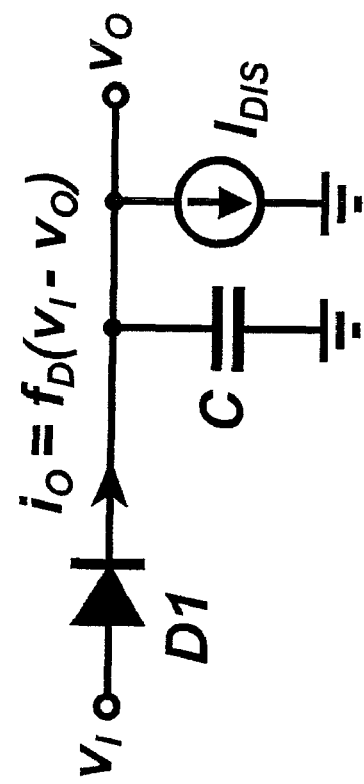
Figure 2:
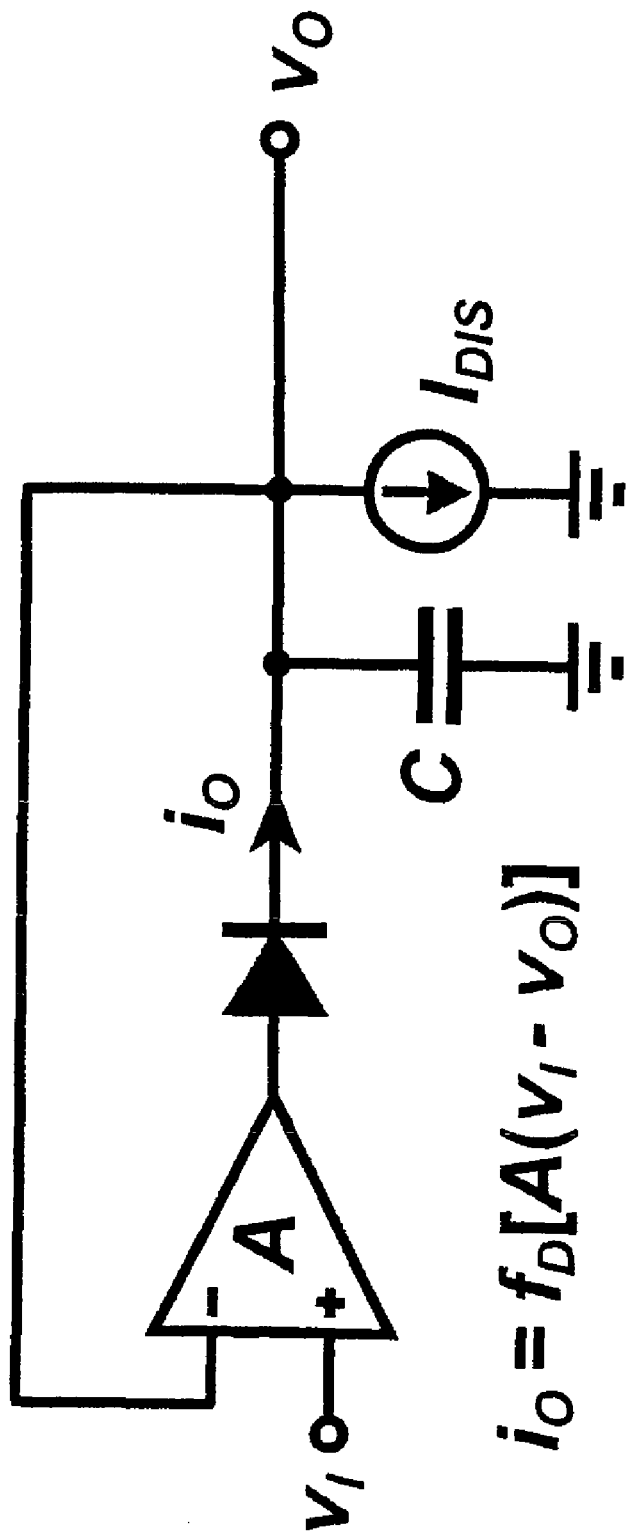
FIG. 2, illustrates a known feedback peak detector.
Figure 3:
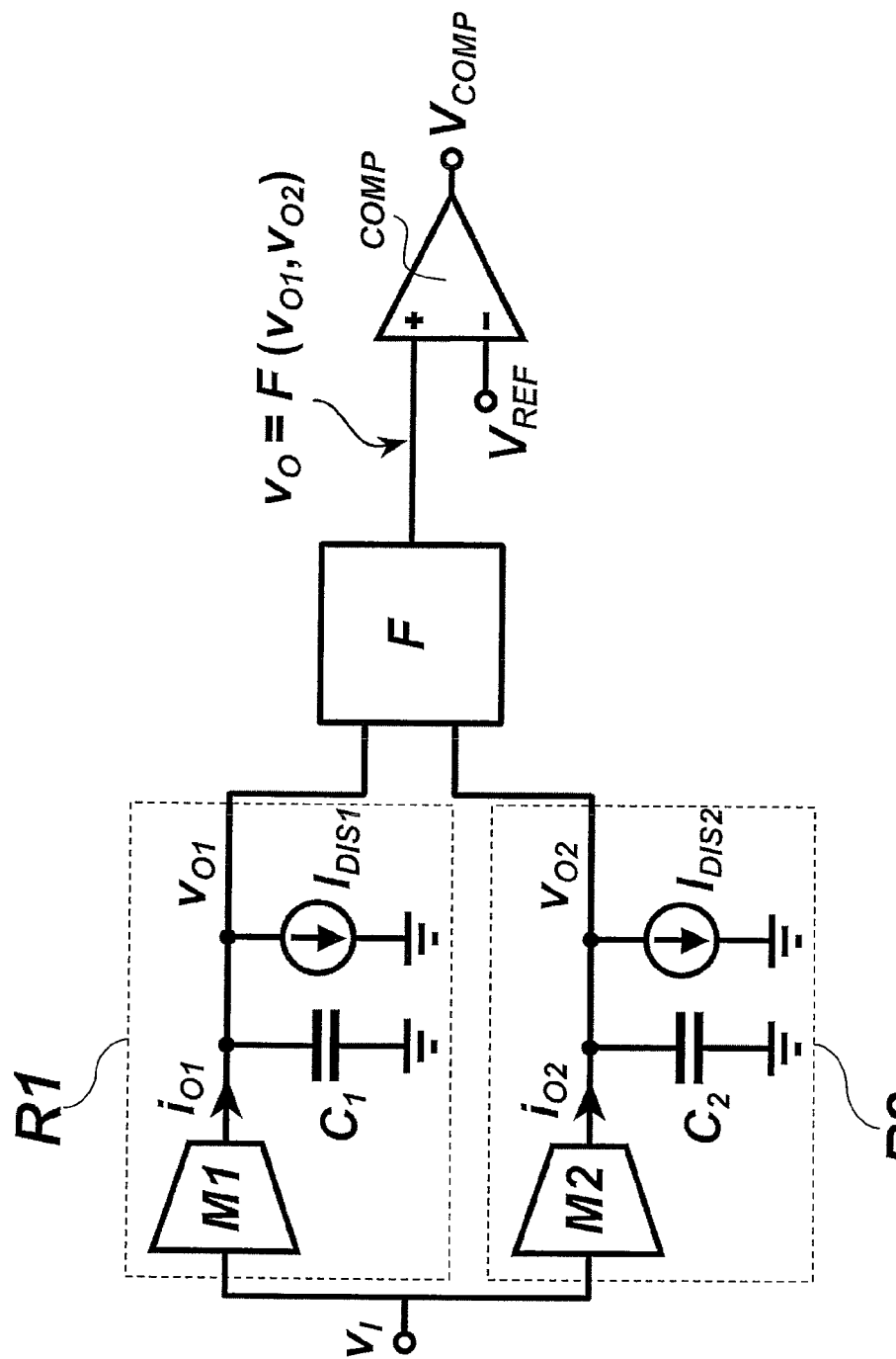
FIG. 3 is a block diagram of a peak detector according to the solution described herein.

With reference to the diagram of FIG. 3, an input voltage $v_I$ supplies two peak detectors R1 and R2, constituted by the two rectifier blocks M1 and M2 (which can be two rectifier elements, as likewise two diodes or two generic transistors), two capacitors C1 and C2, and two discharge elements $I_{DIS1}$ and $I_{DIS2}$. The discharge elements $I_{DIS1}$ and $I_{DIS2}$ can be two current generators or two resistors or other devices capable of bringing about discharge of the capacitors C1 and C2.

The two blocks R1 and R2 are located on two circuit branches in parallel to which the voltage $v_I$ is applied. Flowing out of the two blocks are two currents $i_{O1}$ and $i_{O2}$, which supply, respectively, two branches comprising the two capacitors C1 and C2, and the two discharge elements $I_{DIS1}$ and $I_{DIS2}$, generating the voltages $v_{O1}$ and $v_{O2}$, respectively.

The two peak detectors R1 and R2 have a different ratio between a physical dimension of the rectifier element and the respective discharge current, and in particular it will be assumed in what follows that said ratio is higher for R2. In addition, it is not essential for the values of capacitance of C1 and C2 to be equal; the important thing is that they should be large enough.

The output voltages $v_{O1}$ and $v_{O2}$ of the two detectors R1 and R2 are processed by a combiner block F, which generates at output a combined signal $v_O$.

As will emerge more clearly from what follows, by combining the two outputs it is possible to correct the error committed by each of the two detectors R1 and R2, causing the result of the combination, $v_O$, to be an estimation of the peak value of $v_I$ that is more accurate (i.e., more linear and less sensitive to the crest factor). Said combined signal $v_O$ is compared with a reference voltage $V_{REF}$ by a comparator block COMP, the output of which $V_{COMP}$ is at a high potential if the mean value of $v_O$ exceeds $V_{REF}$.

Figure 4:
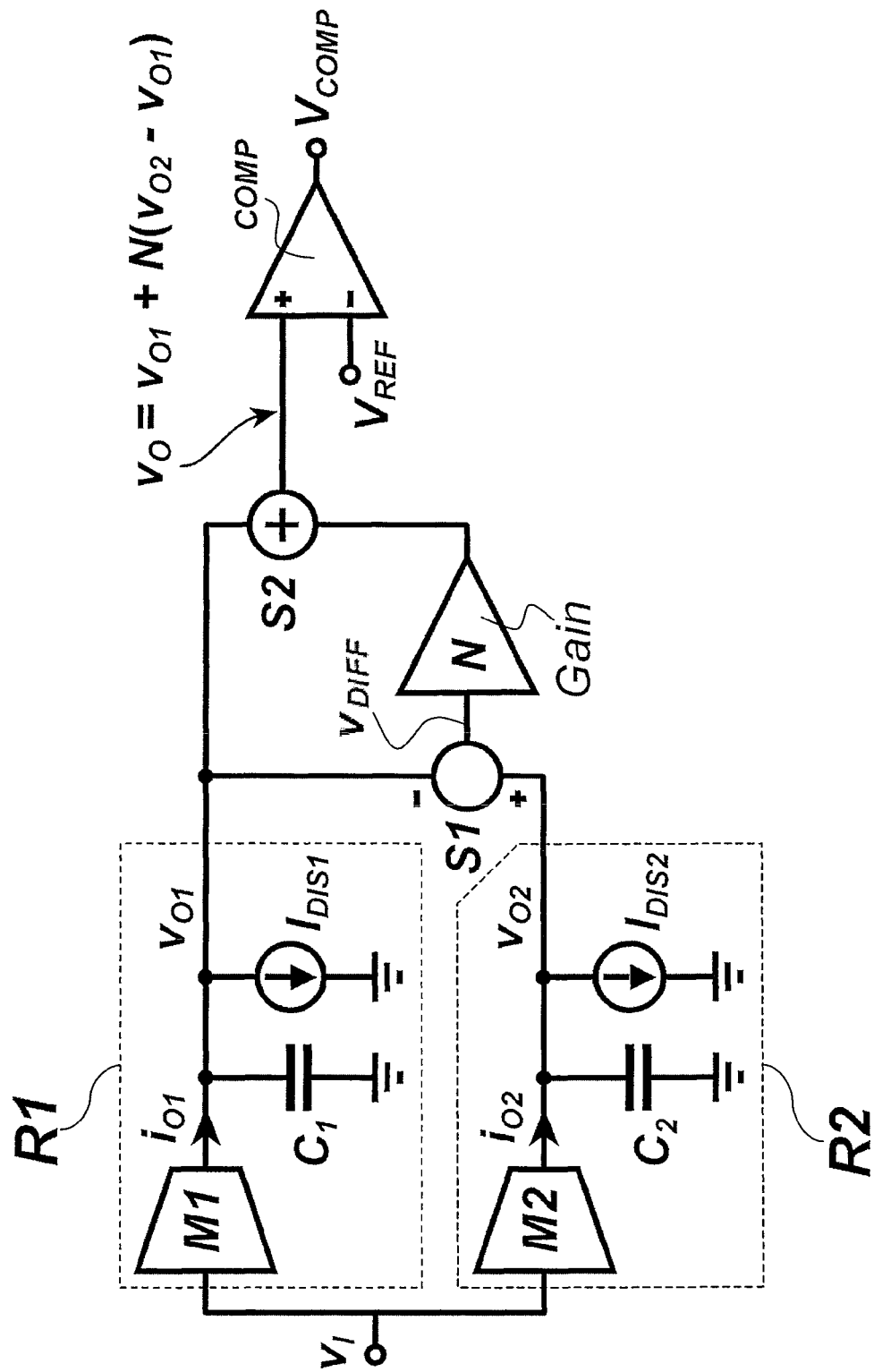
FIG. 4 is an example of embodiment of a block that can be inserted in the block diagram of FIG. 3 for implementing the solution described herein.

In particular, the function of the combiner block F can be simply obtained as represented in FIG. 4, in which the components that are identical to the ones represented in FIG. 3 are designated by the same reference numbers. In particular, the combiner block F of FIG. 3, as represented in FIG. 4, comprises a subtractor node S1, which receives at input the two voltages $v_{O1}$ and $v_{O2}$, an amplifier stage Gain, which amplifies by a factor N and is supplied by the difference signal $v_{DIFF}$ at output from the node S1, and an adder node S2, which receives at input the output of the first detector $v_{O1}$ and the output of the amplification stage. The output $v_O$ of the adder node S2 is equal to $v_O = v_{O1} + N(v_{O2} - v_{O1})$.

Following for simplicity the diagram of FIG. 4, the principle of operation is now described in the particular case where the rectifier elements M1 and M2 are two short-channel MOSFETs. Reference to said components (which suffer more from problems of linearity and accuracy in peak detection on account of their more linear transconductance) aims at highlighting that the solution described herein can also be applied to other cases.

By way of example, in what follows it is assumed that M1 and M2 are equal, and hence $I_{DIS1} > I_{DIS2}$.

In order to understand the reasons for the better accuracy of the voltage $v_O$, it is possible to estimate the behaviour of the two detectors R1 and R2 when the input voltages $v_I$ have the same peak value but considerably different crest factors. In particular, as representative cases, a square wave and a triangular wave will be chosen.

In general, added to the voltage $v_I$ is a d.c. component $V_{DC}$ and a zero-mean periodic component $v_{AC}$.

Without this implying any loss in generality and in order to simplify the analysis, all the voltages that appear in FIG. 4 are referred to the voltage $V_{DC}$, which thus disappears from the equations.

On the hypothesis of short channel (and neglecting for simplicity the body effect), the current $i_{O1,2}$ supplied by the transistors R1 and R2 can be expressed, as a function of the voltages $v_I$ and $v_O$ in the figure, approximately as:

$$i_{O1,2} = k \frac{W_{1,2}}{L_{1,2}} (v_I - v_{O1,2} - V_t) \tag{2}$$

where $W_{1,2}$ is the channel width of the transistors, and $L_{1,2}$ is the channel length.

If the input voltage is a square wave with maximum amplitude $V_{AC}$, by applying Eq. (1) it is found that the mean output voltage of the two detectors $V_{O1,2}^{(square)}$ is $$V_{O1,2}^{(square)} = V_{AC} - V_t - 2\frac{I_{DIS1,2}}{kW_{1,2}/L_{1,2}} \quad (3)$$

If, instead, the input voltage is a triangular wave of the same amplitude $V_{AC}$, it is found that $$V_{O1,2}^{(triangle)} = V_{AC} - V_t - 2\sqrt{\frac{V_{AC}I_{DIS1,2}}{kW_{1,2}/L_{1,2}}} \quad (4)$$

Eqs. (3) and (4) show that the output signal of each of the detectors depends, amongst other things (in general according to an inverse law), upon the ratio between the width $W_{1,2}$ and the current intensity $I_{DIS1,2}$ (or, rather, upon the ratio between the width $W_{1,2}$ divided by the length $L_{1,2}$ and the current intensity $I_{DIS1,2}$).

This is precisely the ratio between a physical dimension of the rectifier element and the intensity of discharge current produced by the generator, which, according to the solution described herein, is chosen different for the two detector blocks R1 and R2. In the specific case of the example illustrated herein, it is assumed that $W_{1,2}/L_{1,2}$ is equal for the two detectors R1 and R2, whilst the current intensity $I_{DIS1,2}$ is different in the two cases. It will be appreciated that what has been said here continues to be valid in the case where the quantity $W_{1,2}/L_{1,2}$ is different for the two detectors R1 and R2, whilst the current intensity $I_{DIS1,2}$ is identical in the two cases.

From Eqs. (3) and (4) it is likewise found that:
the error committed by each of the two detectors R1 and R2 depends upon the particular input waveform;
the estimation of the peak of the triangular wave is affected by an error by defect that is higher (it is a general fact that the maximum of waveforms with higher crest factor is underestimated by peak detectors);
the detector with smaller current always commits a smaller error; and
in the case of a triangular wave, the output is a non-linear function of $V_{AC}$.

There now follows a calculation of the difference between the outputs of the two detectors R1 and R2, in the two cases considered:

$$\Delta V_O^{(square)} = V_{O2}^{(square)} - V_{O1}^{(square)} = \frac{2}{kW_{1,2}/L_{1,2}}(I_{DIS1} - I_{DIS2}) \quad (5)$$

$$\Delta V_O^{(triangle)} = V_{O2}^{(triangle)} - V_{O1}^{(triangle)} \quad (6)$$
$$= 2\sqrt{\frac{V_{AC}}{kW_{1,2}/L_{1,2}}}(\sqrt{I_{DIS1}} - \sqrt{I_{DIS2}})$$

In effect, it is possible to show that the quantity expressed in Eq. (6) is greater than the quantity in Eq. (5). In fact, said statement is equivalent to stating that $$\sqrt{V_{AC}kW_{1,2}/L_{1,2}}(\sqrt{I_{DIS1}}-\sqrt{I_{DIS2}})>(I_{DIS1}-I_{DIS2}) \quad (7)$$

whence $$\sqrt{V_{AC}kW_{1,2}/L_{1,2}}>(\sqrt{I_{DIS1}}+\sqrt{I_{DIS2}}) \quad (8)$$

Eq. (8) is true since the discharge currents are certainly smaller than the peak charge current, which is $$\max(i_{O1,2}) = k\frac{W_{1,2}}{L_{1,2}}(V_{AC} - V_{O1,2} - V_t) \quad (9)$$

and moreover $V_{AC} > (V_{AC} - V_{O1,2} - V_t)$ since certainly $V_{O1,2} > -V_t$.

It is hence justifiable to generalize and state that the difference between the outputs of the two detectors R1 and R2 is greater the higher the crest factor of the input voltage.

On the basis of this, in the solution proposed, said difference is read, amplified, and summed to the output of the first detector, obtaining as result:
a decrease in the non-linearity of the response, which is more marked for inputs with higher crest factor (as may be inferred from Eqs. (3) and (4)); and
a decrease in the error committed by each of the two detectors R1 and R2 as the waveform of the input voltage varies.

Figure 5:
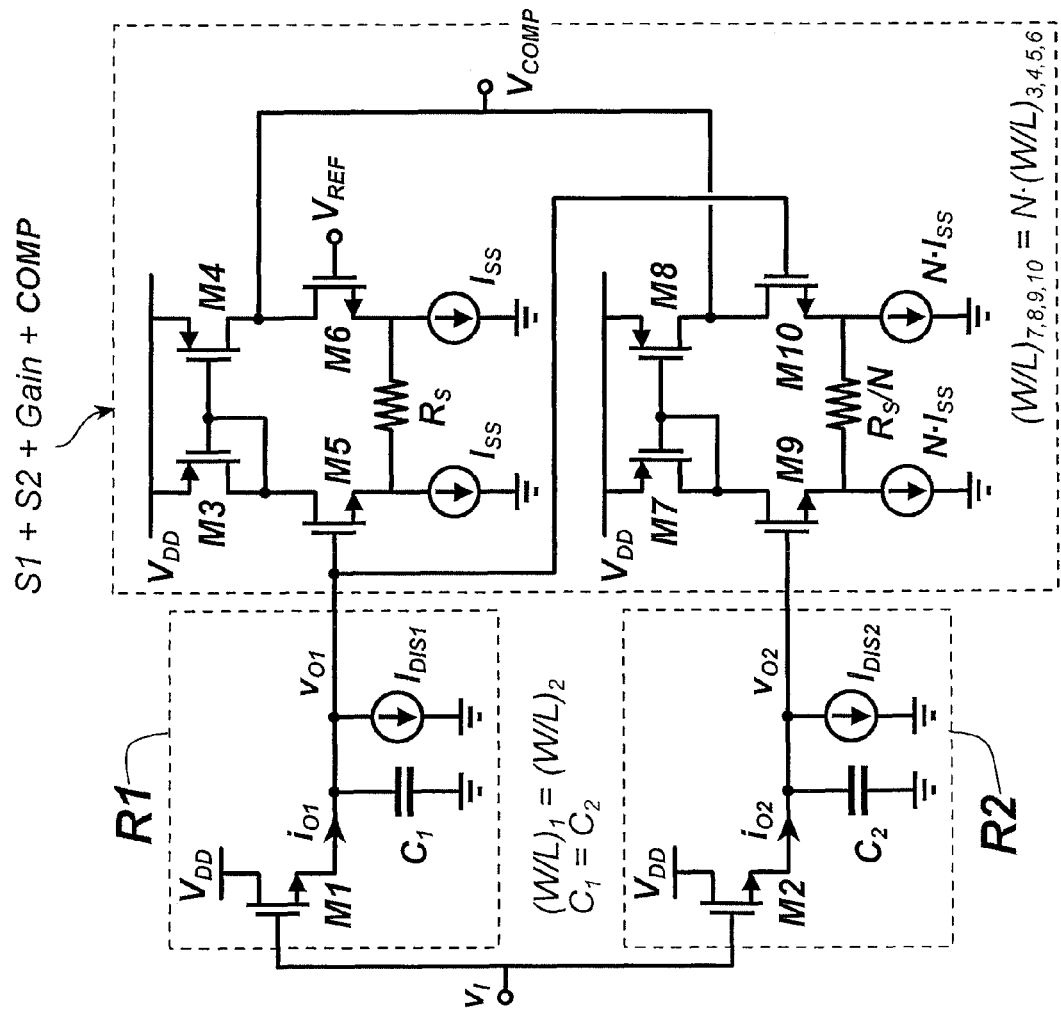
FIG. 5 is an example of a circuit embodiment with MOSFETs of the block diagram of FIG. 4.

FIG. 5 regards a circuit implementation with MOSFETs of the block diagram of FIG. 4.

In particular, the two peak detectors R1 and R2 are obtained using as rectifier elements two MOSFETs M1 and M2. The two MOSFETs M1 and M2 are supplied with the input signal $v_I$ on their respective gate terminals and have their drain terminals connected to a voltage $V_{DD}$. Furthermore, in the example considered herein, the ratios between the channel width and the channel length of the transistors M1 and M2 are equal: $(W/L)_1 = (W/L)_2$.

The two outputs $v_{O1}$ and $v_{O2}$ are connected to two differential-amplifier stages, which comprise, respectively, four MOSFETs.

The first of the two differential-amplifier stages comprises the transistors M3, M4, M5 and M6. The first non-inverting input (gate of the transistor M5) is supplied with the signal $v_{O1}$, whilst the inverting input (gate of the transistor M6) is supplied with the reference voltage $V_{REF}$. The second differential-amplifier stage comprises the transistors M7, M8, M9 and M10. In order to implement the function of the gain stage Gain in FIG. 4, the ratio between the channel width and the channel length $(W/L)_{7,8,9,10}$ of each transistor M7, M8, M9 and M10 is N times the ratio $(W/L)_{3,4,5,6}$ of the corresponding transistor M3, M4, M5 and M6. The non-inverting input of the stage (i.e., the gate of the transistor M9) is supplied with the signal $v_{O2}$, whilst the inverting input (gate of the transistor M10) is supplied with the signal $v_{O1}$.

The two source terminals of the aforesaid transistors M5 and M6 of the first amplifier stage are connected to ground via two current generators $I_{SS}$, and connected to one another by a resistance $R_S$. Instead, in order to implement the function of the gain stage Gain in FIG. 4, the two source terminals of the transistors M9 and M10 of the second amplifier stage are connected to ground via two current generators $NI_{SS}$, and connected to one another by a resistance $R_S/N$.

In this way, the two differential stages implement the functions of subtraction (S1), addition (S2), gain (Gain), and comparison (COMP).

In order to test the actual effectiveness of the solution proposed, presented hereinafter are some results obtained with a harmonic-balance experiment.

Two detectors were implemented in CMOS technology made available by the present applicant. The input voltage was a square wave or triangular wave with d.c. value of 1.5 V and an a.c. voltage $V_{AC}$ that varied from 0 to 1 V. The supply voltage was fixed at 2.5 V. The capacitors $C_1$ and $C_2$ had a value of 5 pF. In addition, it was possible to estimate $kW_{1,2}/L_{1,2}$=4.2 mA/V. The amplification factor N was fixed and equal to 5. The currents had the value $I_{DIS1}$=100 µA and $I_{DIS2}$=25 µA. The frequency was fixed at 1 GHz.

Figure 6:
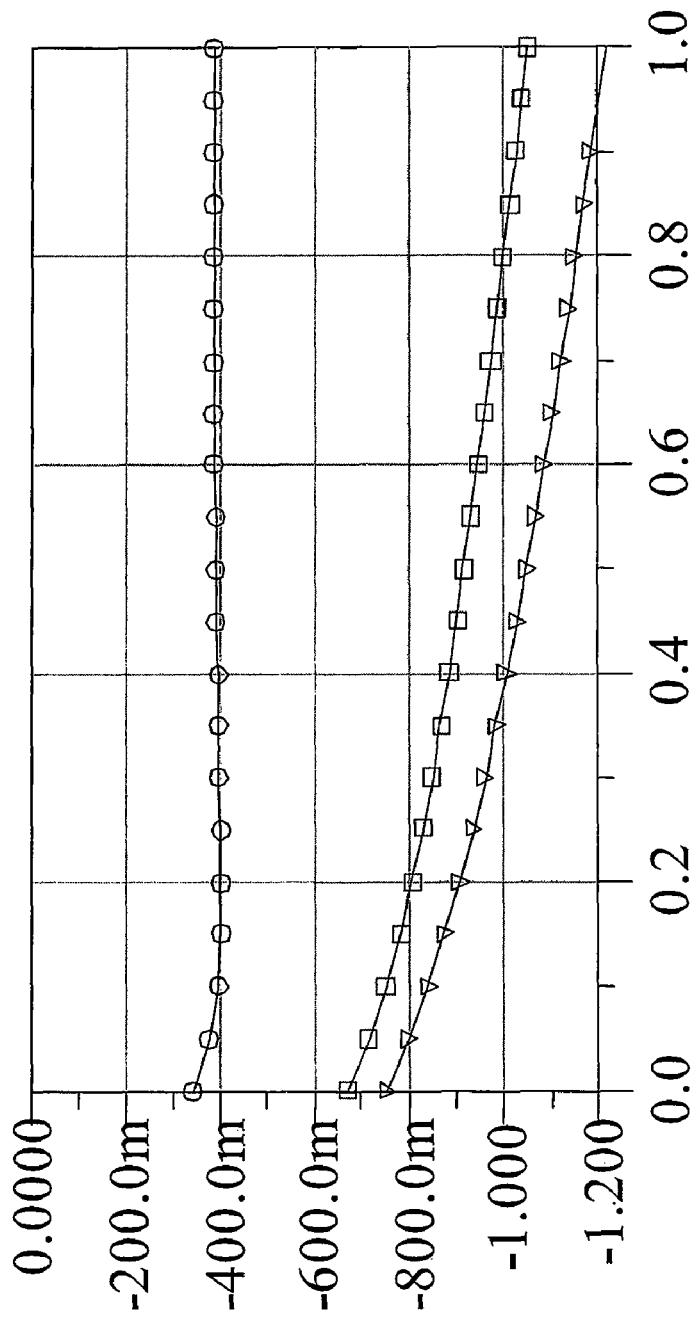
FIG. 6 shows the detection error for a triangular-wave input in the case of a single detector and in the case of the solution described herein.
Figure 7:
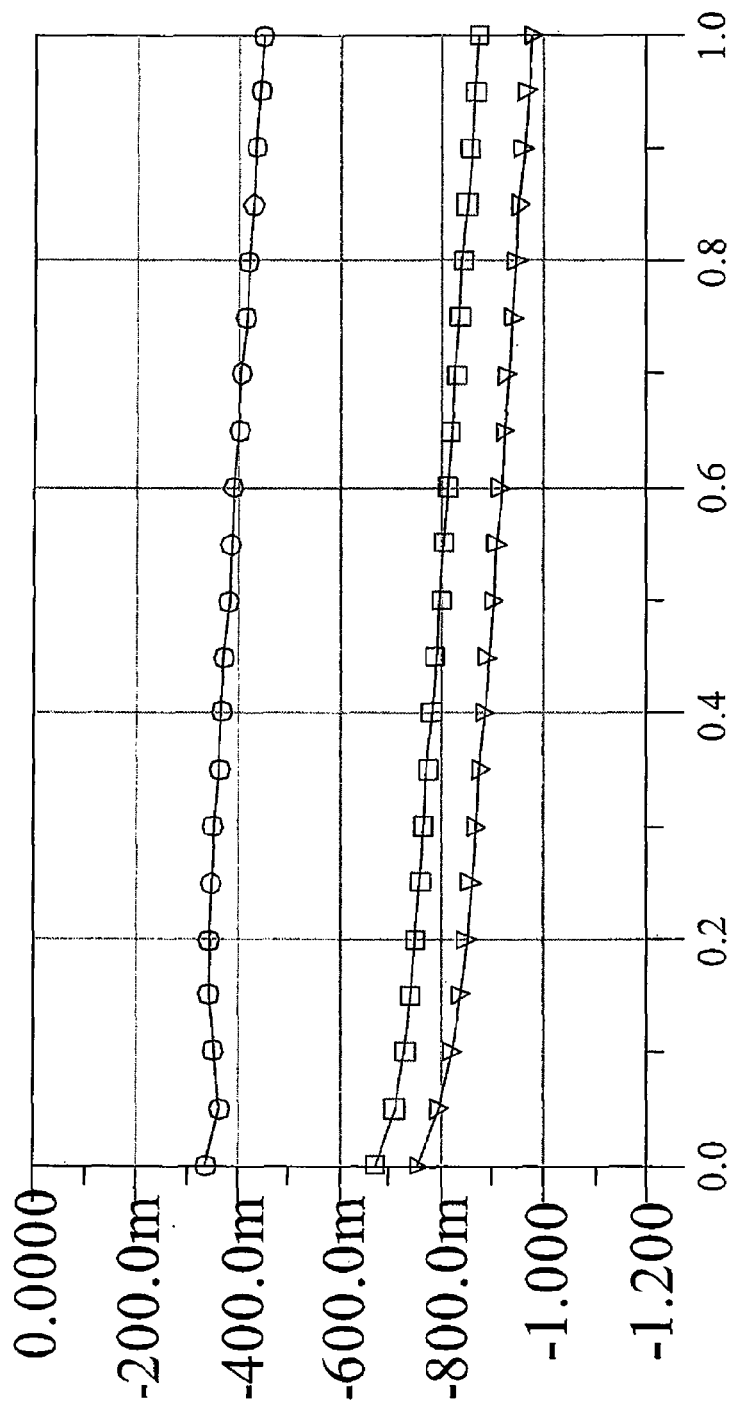
FIG. 7 shows the detection error for a square-wave input in the case of a single detector and in the case of the solution described herein.

FIGS. 6 and 7 show the detection error committed by the two detectors taken individually, together with the voltage processed according to the solution described herein, in the case of input with triangular and square wave, respectively.

It may be noted that:
the non-linearity of the response of the individual detectors is worse for triangular-wave inputs, as expected from the theory; and
the non-linearity is markedly corrected, in both cases, by the solution described herein.

Since the residual error of approximately 400 mV is constant as $V_{AC}$ varies and has a low dependence upon the waveform, it can be readily corrected by altering the value of $V_{REF}$ accordingly.

Figure 8:
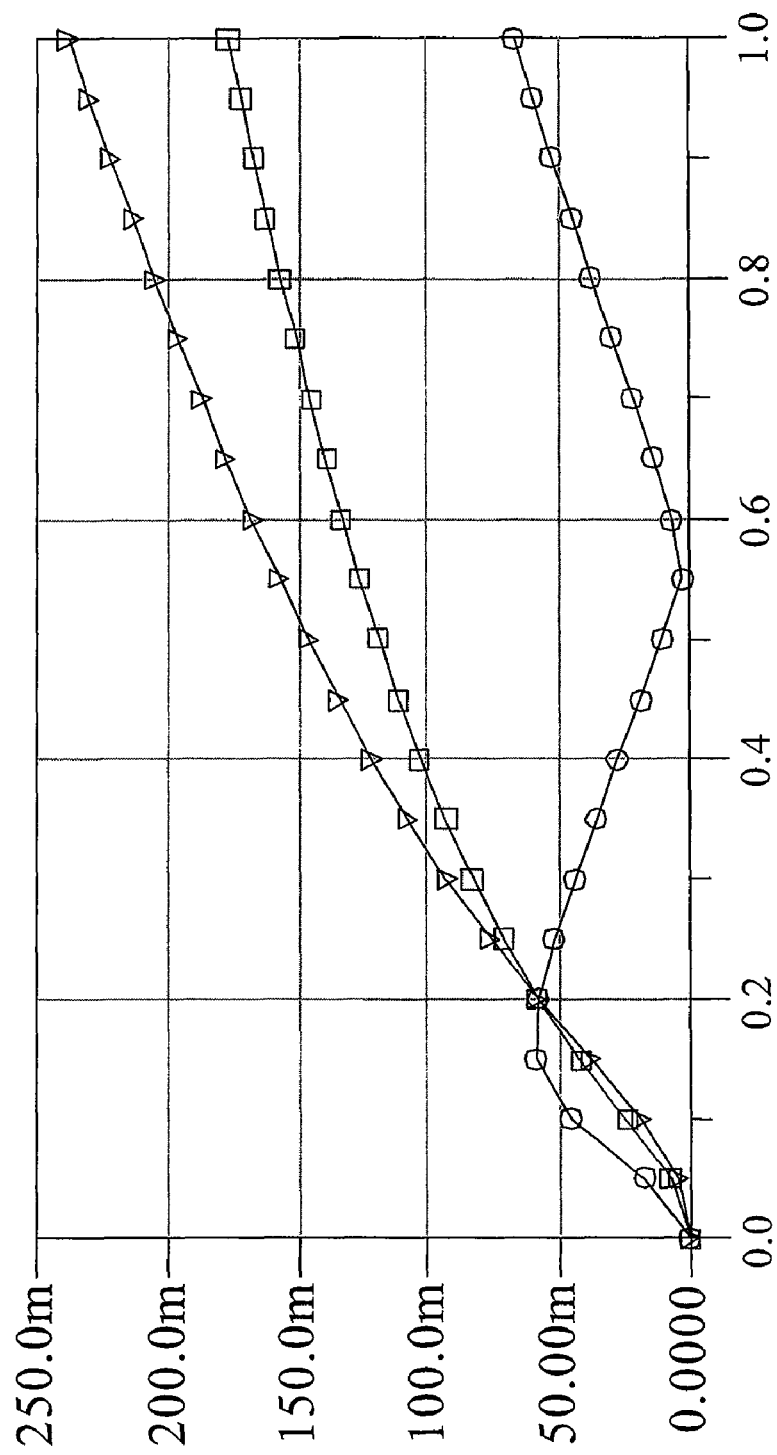
FIG. 8 shows the difference between detection of the square wave and the triangular wave (in absolute value) in the case of a single detector and in the case of the solution described herein.

Given in FIG. 8 is the difference between the value detected for the square wave and triangular wave.

It may be noted that:
both of the detectors commit an error that increases with the input voltage;
the detector with less current (squares) generally commits a smaller error, as expected from the theory; and
the solution described herein succeeds in correcting considerably the maximum error committed in the detection of the two waveforms.

In particular, in FIGS. 6, 7 and 8 the line that joins the triangles refers to the detector R1, the line that joins the squares refers to the detector R2, whilst the line that joins the circles refers to the solution described herein.

Use of the solution described herein enables detection of the effective peak value of the input voltage with a greater precision, hence facilitating design of robust and efficient power amplifiers. In addition, in the embodiment that uses MOSFETs, the peak value at input is detected better and, at the same time, there is a comparison with a reference voltage.

The solution described herein can be used effectively not only for implementing protection circuits for power amplifiers, but also in all the situations in which it is necessary to compare the peak value of a voltage the crest factor of which is not known a priori with a reference voltage.

Consequently, without prejudice to the principle of the invention, the details of construction and the embodiments may vary, even significantly, with respect to what is described and illustrated herein, purely by way of non-limiting example, without thereby departing from the scope of the invention, as defined in the ensuing claims.

We claim:

1. A peak detector circuit comprising:
an input node and an output node;
a first peak detector having an input coupled to the input node;
a second peak detector having an input coupled to the input node;
a first amplifier having a positive input coupled to an output of the first peak detector and a negative input for receiving a reference voltage; and
a second amplifier having a positive input coupled to an output of the second peak detector and a negative input coupled to the output of the first peak detector,
wherein outputs of the first and second amplifier are coupled together and to the output node.

2. The peak detector circuit of claim 1 wherein the first and second peak detectors comprise equal detection capacitors.

3. The peak detector circuit of claim 1 wherein the first and second amplifiers comprise unequal source resistors.

4. The peak detector circuit of claim 1 wherein the first and second amplifiers comprise unequal bias currents.

* * * * *